United States Patent [19]
West et al.

[11] 4,344,106
[45] Aug. 10, 1982

[54] TRANSISTOR HEAT SINK ASSEMBLY

[75] Inventors: Charles E. West, Brownsburg; Robert J. Ramspacher, Jr., Indianapolis, both of Ind.

[73] Assignee: RCA Corporation, New York, N.Y.

[21] Appl. No.: 210,838

[22] Filed: Nov. 26, 1980

[51] Int. Cl.³ .............................................. H05K 7/20
[52] U.S. Cl. .................................. 361/386; 165/185; 174/16 HS; 357/81
[58] Field of Search ........ 357/81; 174/16 HS, 52 FP; 165/80 R, 80 A, 80 B, 80 D, 185; 361/383, 386, 388, 405

[56] References Cited

U.S. PATENT DOCUMENTS 3,519,889 7/1970 Monaco .......................... 174/16 HS
3,641,474 1/1972 Owens ................................. 361/386
4,254,447 3/1981 Griffis ................................. 361/386

FOREIGN PATENT DOCUMENTS 2839458 3/1979 Fed. Rep. of Germany ...... 361/386

Primary Examiner—Gerald P. Tolin
Attorney, Agent, or Firm—Paul J. Rasmussen; William H. Meagner; W. Brinton Yorks, Jr.

[57] ABSTRACT

A heat sink for a transistor is provided which comprises a long and a short vertical portion joining a sloped upper surface. The transistor is bolted to the sloped surface with its leads extending below the bottom of the vertical portions. The transistor leads are inserted into a large slot in a printed circuit board, and the assembly is rotated to engage tabs on the short vertical portion and then the long vertical portion in mating holes in the printed circuit board. The assembly will then snap into place, with the transistor oriented at an oblique angle with respect to the plane of the board. There is no need to bend or preform the leads, and the oblique orientation of the transistor reduces the horizontal and vertical forces of vibration and thermal expansion and contraction by a factor of two.

4 Claims, 6 Drawing Figures

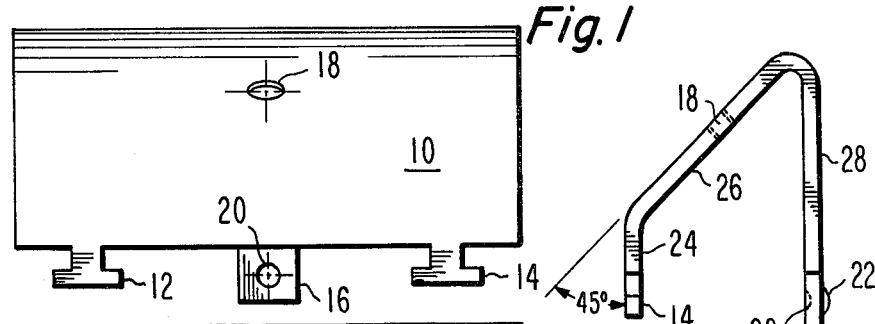
Fig. 1
Fig. 2
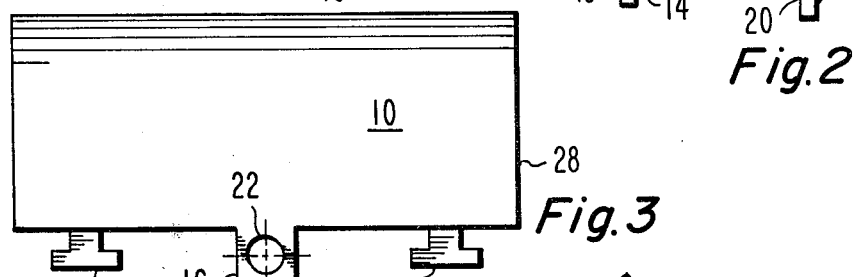
Fig. 3
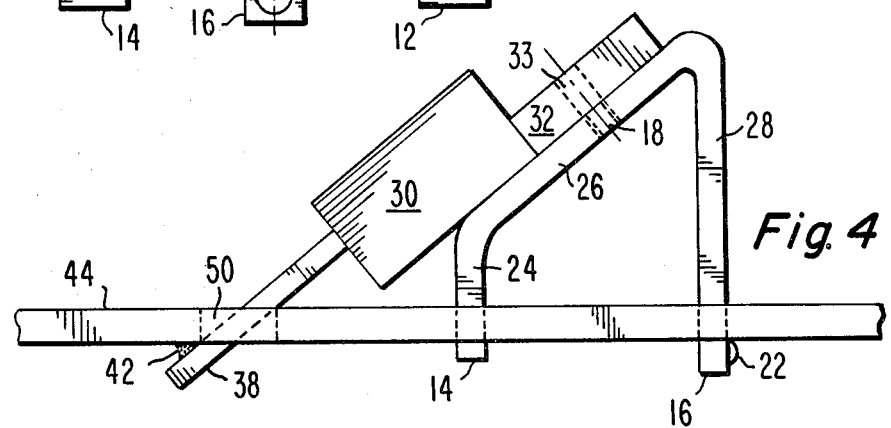
Fig. 4
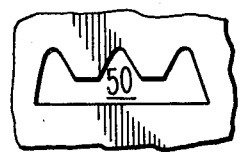
Fig. 5
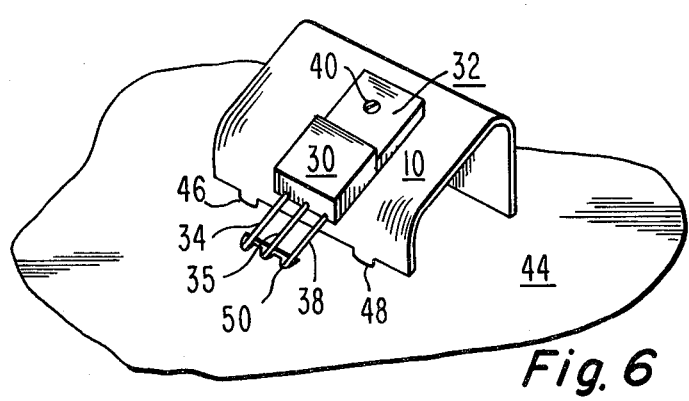
Fig. 6

TRANSISTOR HEAT SINK ASSEMBLY

This invention relates to a printed circuit board assembly and, in particular, to a printed circuit board heat sink upon which a transistor is mounted and which requires no bending of the transistor leads when affixed to a printed circuit board.

A common configuration for power transistors is the TO-220 transistor package. The semiconductor element is mounted on a metallic heat-conducting tab which extends out the top of the plastic encapsulation material. The three transistor leads extend below the body of plastic encapsulation material. The transistor is conventionally mounted in a vertical or horizontal position, with the heat-conducting tab bolted to a heat sink. With the tab in close thermal contact with the heat sink, the transistor is capable of handling a considerable amount of power, and will dissipate a great deal of heat through the tab and the heat sink.

When the transistor and the heat sink are mounted on a printed circuit board with the transistor body in a horizontal position, it is necessary to bend the leads at a 90 degree angle for insertion and soldering to conductors on the printed circuit board surface. When mounted in either a horizontal or vertical position, the leads are generally bent for insertion in staggered holes in the board. The holes are arranged in a triangular relationship, and the leads are accordingly formed to mate with the staggered holes. The bending, or preforming of the leads to the staggered relationship requires an additional step in the assembly process.

When the transistor leads are preformed to match the hole configuration, they must be bent beyond their desired position. The leads will tend to try to return to their original position, a phenomenon known as "lead bend memory". The bending of the leads and their tendency to return to their original position will produce internal stresses at the junction of the leads and the device package. This stress, when combined with the expansion and contraction forces resulting from the normal thermal cycling of the power transistor, will significantly reduce the operating life of the transistor. It is therefore desirable to mount the transistor without bending or preforming the leads prior to insertion and soldering.

When the transistor and the heat sink are mounted, it is desirable for the assembly to be capable of withstanding shipping vibrations and the forces resulting from thermal expansion and contraction. With the transistor mounted in a vertical position, the strong vertical components of these forces will be directed entirely along the plane in which the transistor is mounted. Accordingly, it is desirable to mount the transistor and heat sink in a manner which reduces the effects of these forces.

Finally, it is desirable that the transistor and heat sink assembly be capable of being quickly and easily mounted on a printed circuit board.

In accordance with the principles of the present invention, a heat sink for a transistor is provided, which comprises a long and a short vertical portion joining a sloped upper surface. The transistor is bolted to the sloped surface with its leads extending below the bottom of the vertical portions. The transistor leads are inserted into a large slot in a printed circuit board, and the assembly is rotated to engage tabs on the short vertical portion and then the long vertical portion in mating holes in the printed circuit board. The assembly will then snap into place, with the transistor oriented at an oblique angle with respect to the plane of the board. There is no need to bend or preform the leads, and the oblique orientation of the transistor reduces the horizontal and vertical forces of vibration and thermal expansion and contraction by a factor of two.

In the drawings:

FIG. 1 is a front view of a heat sink constructed in accordance with the principles of the present invention;

FIG. 2 is a side view of the heat sink of FIG. 1;

FIG. 3 is a rear view of the heat sink of FIGS. 1 and 2;

FIG. 4 is a side view of a heat sink and transistor assembly mounted in a printed circuit board in accordance with the principles of the present invention;

FIG. 5 is a plan view of the lead terminal hole of FIG. 4; and

FIG. 6 is a perspective view of the printed circuit board assembly of FIG. 4.

Referring concurrently to FIGS. 1, 2 and 3, three views of a heat sink constructed in accordance with the principles of the present invention are shown. The heat sink thereshown includes a body 10 of terne-coated sheet steel. The body 10 is bent at two places to form a short vertical front section 24, a sloping intermediate section 26, and a long vertical rear section 28. The intermediate section 26 is sloped at an angle of approximately forty-five degrees with respect to the two vertical sections 24 and 28, as shown in FIG. 2. The forty-five degree slope provides optimum resolution of vibrational forces on the transistor-heat sink assembly into their horizontal and vertical components; however a slope of less than forty-five degrees may be desirable for providing improved lead solderability, for instance.

Two T-shaped tabs 12 and 14 are formed at the bottom of the vertical front section 24. A single rectangular tab 16 is formed at the bottom center of the rear section 28. An indentation 20 is pressed into the rear tab 16 to form a protrusion 22 which projects outward from the back of the tab 16. A hole 18 is drilled and threaded in the sloping section 26, upon which a transistor is to be mounted.

A TO-220 transistor is shown mounted on the heat sink in FIG. 4. The semiconductor element is encapsulated in a plastic body 30, and is in contact with a metallic tab 32, which extends upward from the top of the plastic body 30. Three leads extend from the bottom of the plastic body. One of these leads is shown in FIG. 4. A hole 33 in the tab 32 is aligned with the hole 18 in the heat sink to permit the transistor to be bolted to the heat sink.

The transistor and heat sink assembly is mounted in a printed circuit board as shown in FIGS. 4 and 6. The leads 34, 35, and 38 of the transistor are first inserted in a hole 50 in the printed circuit board 44. The hole 50 includes individual notches extending forward from the main slot to separate the three transistor leads. A plan view of the hole 50 is shown in FIG. 5. Once the lead ends have been inserted into the hole 50, the assembly is rotated down toward the board to engage the T-shaped tabs 12 and 14 in slots 46 and 48. The assembly is further rotated and sections 24 and 28 compressed slightly so that rear tab 16 engages a fourth hole in the board. As the tabs of the heat sink engage the board, the transistor leads slide forward into the hole 50, and the entire assembly snaps into place. When the assembly is mounted, the broad ends of tabs 12 and 14 hold the front of the heat sink in the board, and the protrusion 22 holds the rear tab in place. The opposing spring force of the two vertical sections holds the entire assembly in place prior to soldering. There is no need to twist or otherwise bend the tabs to hold the assembly in place.

The circuit board assembly may be soldered in place by any known technique. A solder fillet 42 will form readily between each lead and the copper foil on the underside of the printed circuit board 44. The tabs 12, 14 and 16 are also easily soldered to copper foil on the underside of the board.

As FIGS. 4 and 6 clearly illustrate, the oblique mounting of the transistor eliminates the need to bend or preform the transistor leads prior to assembly. This improves the reliability of the transistor, since no junction stresses are created by lead bends. The oblique mounting angle of the transistor also allows forces generated by shipping vibrations and board thermal expansion and contraction to be resolved into their horizontal and vertical components outside the plane of the mounted transistor. The effect of the forty-five degree mounting angle is to divide these forces by a factor of two, which also improves transistor reliability.

The transistor and heat sink assembly of the invention is also characterized by a significant heat sink area with a lower profile than prior art assemblies in which the transistor is mounted vertically. Air will flow both above and below the sloping section 26 of the heat sink, which improves cooling of the transistor.

What is claimed is:

1. A thermally protected semiconductor assembly suitable for mounting on a printed circuit board comprising:
a heat sink comprising a rectangular sheet of metal folded at two fold lines which are substantially parallel to each other and to first and second opposing edges of said sheet, the distance between one of said fold lines and the nearest one of said opposing edges being greater than the distance between the other one of said fold lines and the other one of said opposing edges, with a first region of said sheet between said one of said fold lines and said nearest one of said opposing edges being disposed in a plane which is substantially parallel to the plane of a second region of said sheet between said other one of said fold lines and said other one of said opposing edges, said two fold lines being separated by a third region of said sheet which forms an acute angle with said first region at said one of said fold lines, and which forms an obtuse angle with said second region at said other one of said fold lines, said first and second opposing edges including means for securing said heat sink to a printed circuit board; and
a semiconductor device including a semiconductor element encapsulated by a body of insulating material, with a heat sink tab extending from a first end of said body of insulating material and lead terminals extending from a second end of said body of insulating material, said heat sink tab being secured to said third region of said heat sink such that said first end of said body of insulating material is closer to said one of said fold lines than said second end.

2. A printed circuit board assembly which provides thermal protection for a transistor device including a semiconductor element encapsulated by a body of insulating material, with a heat sink tab extending from a first end of said body and lead terminals extending from a second end of said body in substantially parallel planes, comprising:
a heat sink comprising a rectangular sheet of metal folded at first and second fold lines, separated by a first region of said sheet, said fold lines being substantially parallel to each other and to first and second opposing edges of said sheet, the distance between said first fold line and said first opposing edge being greater than the distance between said second fold line and said second opposing edge, with a second region of said sheet bounded by said first fold line and said first opposing edge being disposed in a plane which is substantially parallel to the plane of a third region of said sheet bounded by said second fold line and said second opposing edge, said first and second region forming a first acute angle at said first fold line and said first and third region forming an obtuse angle at said second fold line, said first and second opposing edges including tabs for securing said heat sink to a printed circuit board, said transistor heat sink tab being fastened to said first region of said heat sink with said first end of said transistor body being nearer to said first fold line than said second end; and
a printed circuit board, including holes receiving said tabs to mount said heat sink with said second and third regions being substantially perpendicular to said printed circuit board, and a further hole through which said leads terminals of said transistor extend, said lead terminals and the surface of said printed circuit board defining a second acute angle, wherein the sum of said first and second acute angles is substantially equal to ninety degrees.

3. The printed circuit board assembly of claim 2, wherein the sum of said first and second acute angles is substantially equal to ninety degrees.

4. The printed circuit board assembly of claim 2, wherein said further hole of said printed circuit board includes separate respective channels located perpendicular to a main channel, said separate channels receiving and separating said respective lead terminals of said transistor device.

* * * * *